United States Patent [19]
Seshan et al.

[11] Patent Number: 6,163,065
[45] Date of Patent: *Dec. 19, 2000

[54] ENERGY-ABSORBING STABLE GUARD RING

[75] Inventors: Krishna Seshan, San Jose, Calif.; Mirng-Ji Lii, Chandler, Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/002,116

[22] Filed: Dec. 31, 1997

[51] Int. Cl.⁷ .................. H01L 23/544; H01L 23/552; H01L 29/00; H01L 23/48

[52] U.S. Cl. .................. 257/620; 257/659; 257/508; 257/758; 257/797

[58] Field of Search .................. 257/758, 753, 257/797, 773, 620, 659, 605, 508

[56] References Cited

U.S. PATENT DOCUMENTS

| | | | |
|---|---|---|---|
| 4,893,163 | 1/1990 | Rudeck | 257/797 |
| 5,270,256 | 12/1993 | Bost et al. | 257/620 |
| 5,652,459 | 7/1997 | Chen | 257/605 |
| 5,834,829 | 11/1998 | Dinkel et al. | 257/620 |
| 5,936,311 | 8/1999 | Watrobski et al. | 257/797 |

*Primary Examiner*—Steven H. Loke
*Attorney, Agent, or Firm*—Blakely, Sokoloff, Taylor & Zafman LLP

[57] ABSTRACT

An integrated circuit (IC) is provided. The IC includes a substrate and at least one dielectric layer and a metal layer formed upon the substrate. The at least one dielectric layer and metal layer form a die active area. The IC further includes a guard ring, enclosing the die active area. The guard ring has zig-zag shaped portions at corners thereof.

16 Claims, 5 Drawing Sheets

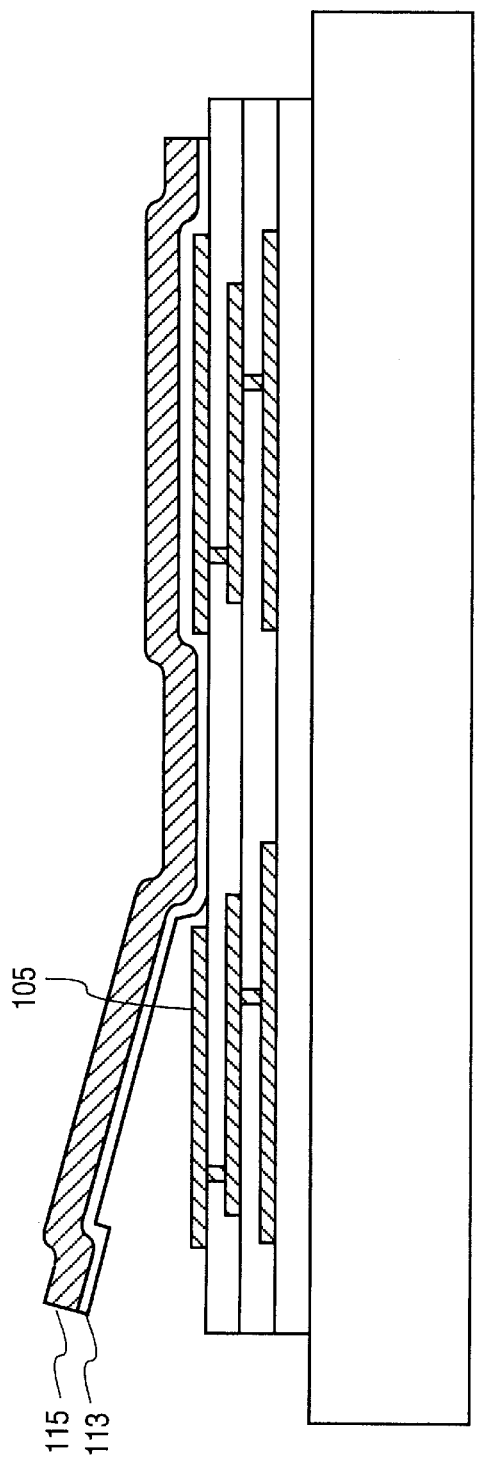
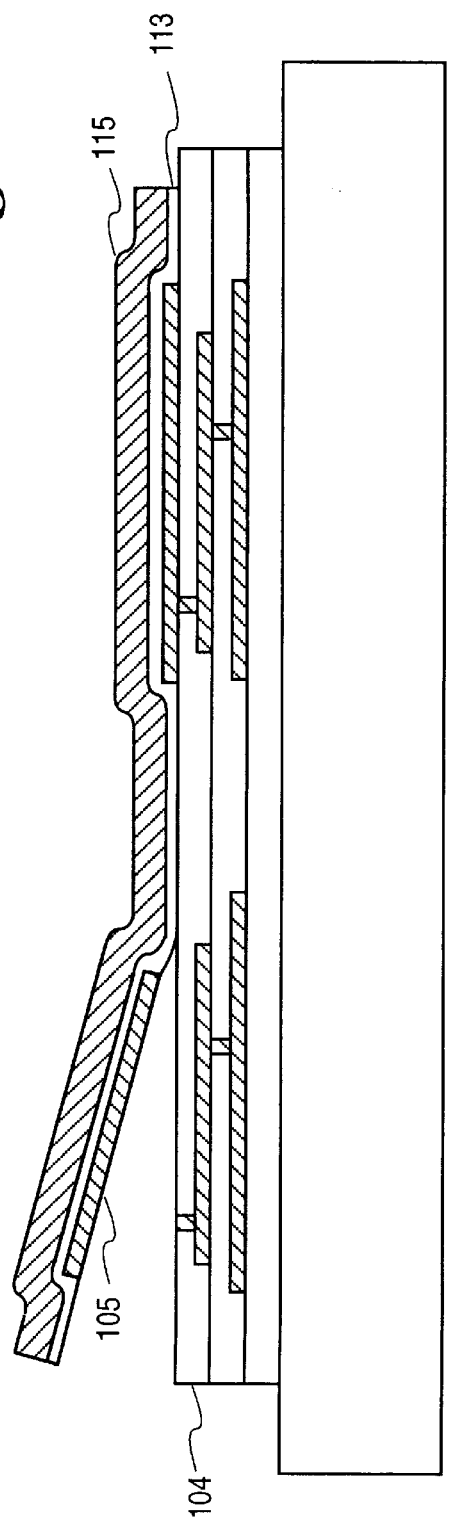

ENERGY-ABSORBING STABLE GUARD RING

BACKGROUND OF THE INVENTION (1) Field of the Invention

The present invention relates to the field of semiconductor fabrication. More specifically, the present invention relates to integrated circuits with structures that reduce or prevent damages to the integrated circuit.

(2) Background Information

Presently, semiconductor integrated circuits are manufactured by deposition and etch of a number of layers upon a silicon (Si) wafer. Device regions are formed within the Si wafer and then layers of conductive and non-conductive material are formed over the device regions. These layers are then masked and etched to form semiconductor devices which are then connected by the use of conductive layers. The conductive layers typically include metal layers which are deposited, masked and etched to form interconnects. Subsequent layers are formed so as to define additional devices and interconnects. A top dielectric layer (hereinafter referred to as "passivation layer") is typically deposited over a top metal layer (hereinafter referred to as "terminal metal layer" or "TML" ) to planarize, insulate, prevent moisture penetration, thin film cracking, and other types of mechanical and chemical damages which may occur during assembly, packaging and operation of the individual integrated circuit die on the wafer.

FIG. 1 shows a cross-sectional view through a semiconductor wafer 100. Semiconductor wafer 100 includes a silicon substrate 101 that has several dielectric layers 102, 103 and 104 formed thereupon by processes that are well-known in the art. The figure also shows three metal layers that have been deposited, masked, and etched to form metal layers 105, 106, and 107. Metal layers 105-107 overlie device regions to connect the various devices and the subsequently deposited metal layers. A top dielectric layer 111 (passivation layer) is then formed over the terminal metal layer 105 to planarize and insulate the electrical devices and interconnects, to prevent leakage of electrical current through the passivation layer, etc. The passivation layer 111 may include a hard passivation layer 113 typically made of silicon nitride (SiN) and a soft passivation layer typically made of polyamide 115. The polyamide layer covers the Silicon/Nitride layer. The soft passivation layer is deposited by Plasma Enhanced Chemical Vapor Deposition or other typically known passivation layer deposition processes. The layer of silicon nitride is then covered by polyamide or another type of soft passivation layer.

FIG. 2(a) illustrates a cross-section through the semiconductor wafer of FIG. 1 where the soft passivation layer 115 is partly delaminated from the hard passivation layer 113. The delamination typically allows moisture and other impurities to penetrate in the semiconductor wafer. One reason for the passivation layer's delamination is that the die is assembled into a plastic package which is more conducive to propagation of external forces within the package and to the die. The passivation layer may also delaminate when the die and the passivation layer are subjected to pressure pot testing (steam at a pressure greater than atmospheric pressure). One theory explaining this type of delamination is that steam dissolves or weakens the bonds within the passivation layer causing the passivation layer itself to delaminate.

Delamination is more likely to occur at the interface between the passivation layer 111 and the terminal metal layer 105. Delamination typically starts at the edge of the die and propagates towards the center of the die. If the delamination reaches an electrical interconnect, the forces within the die that cause the delamination are applied to the electrical interconnect causing the electrical interconnect to rip apart at weak points thereof.

FIG. 2(b) illustrates another cross section of the semiconductor wafer of FIG. 1 where the polyamide layer 115 delaminates together with the silicon nitride layer 113.

FIG. 2(c) illustrates a cross section of the semiconductor wafer of FIG. 1 where the terminal metal layer 105 and the passivation layer 111, including the silicon nitride layer 113 and the polyamide layer 115, delaminate from dielectric layer 104 as a result of external forces applied to the semiconductor wafer of FIG. 1.

In certain integrated circuits, the TML includes a continuous guard ring that surrounds a die active area of the integrated circuit. The guard ring protects the die active area from damages. Damages, among other things, include invasion by foreign impurities, such as sodium and magnesium, that are existent in the environment, certain mechanical damages, including micro-cracks that may be produced when a saw cuts a wafer into dices. Microcracks then propagate to die active areas of the chips producing damages thereto.

Present state of the art guard rings are not robust enough to withstand the various forces exerted to the IC. The guard rings may get broken during reliability testing, specifically during temperature cycling, to which the integrated circuit is subjected. Shear forces may be exerted to the guard ring during temperature cycling causing damages particularly at and near the corners of the guard ring where these forces have a more destructive effect.

FIG. 3 illustrates a die 300 with a guard ring 304 surrounding a die active area 301. The guard ring is exposed to higher shear forces at the corners and in the vicinity of the corners of the die 300 where the horizontal shear force $\tau_x$ is combined with the vertical shear force $\tau_y$ producing shear force $\tau_{xy}$ in a horizontal plane. These forces are produced by expansion and contraction of the IC package during computer and temperature cycling. The guard ring may also be exposed to lifting forces. It is desirable to provide an integrated circuit with a guard ring configured to prevent damages produced by shearing and lifting forces.

SUMMARY OF THE INVENTION

The present invention provides an integrated circuit (IC) that includes a silicon substrate, and at least one dielectric layer and a metal layer formed upon the silicon substrate. The at least one dielectric layer and metal layer form a die active area. The IC further includes a guard ring, enclosing the die active area. The guard ring has zig-zag shaped portions at corners thereof.

BRIEF DESCRIPTION OF THE DRAWINGS

The features, aspects, and advantages of the present invention will become more fully apparent from the following Detailed Description, appended claims, and accompanying drawings in which:

FIGS. 2a, 2b, and 2c illustrate cross-sectional views through the semiconductor wafer of FIG. 1 exhibiting different types of delamination of a passivation layer and of a terminal metal layer;

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
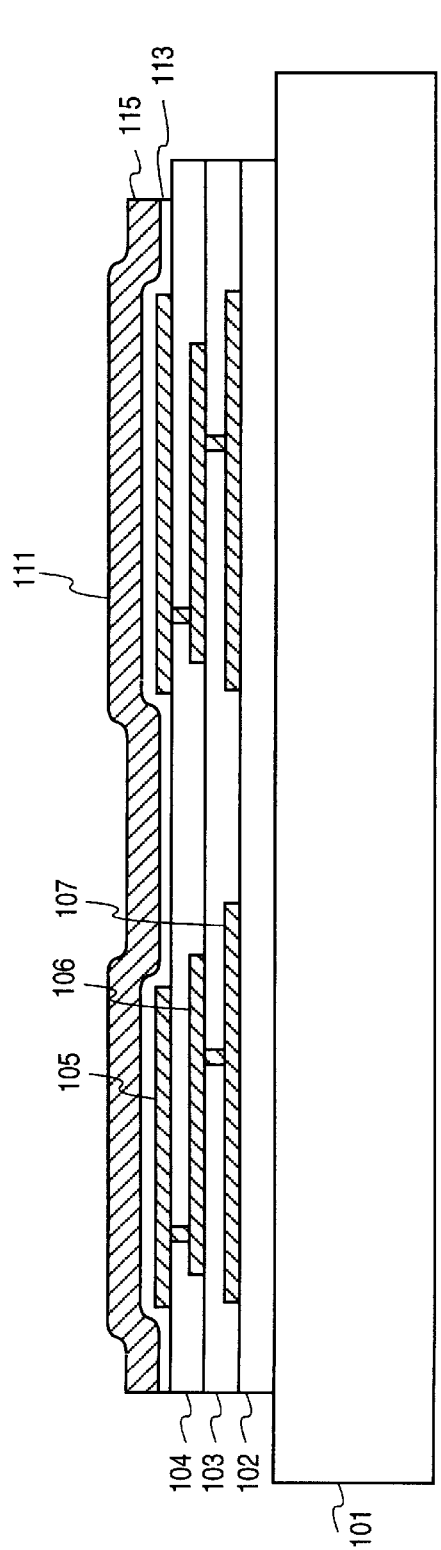
FIG. 1 shows a cross-sectional view through a semiconductor wafer.
Figure 2A:
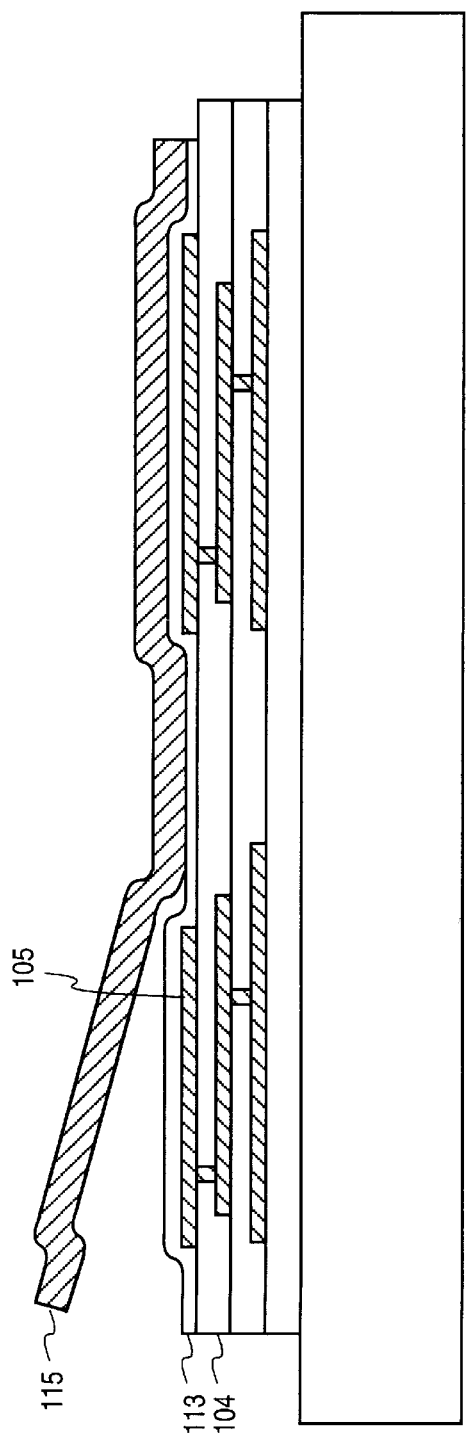
Figure 3:
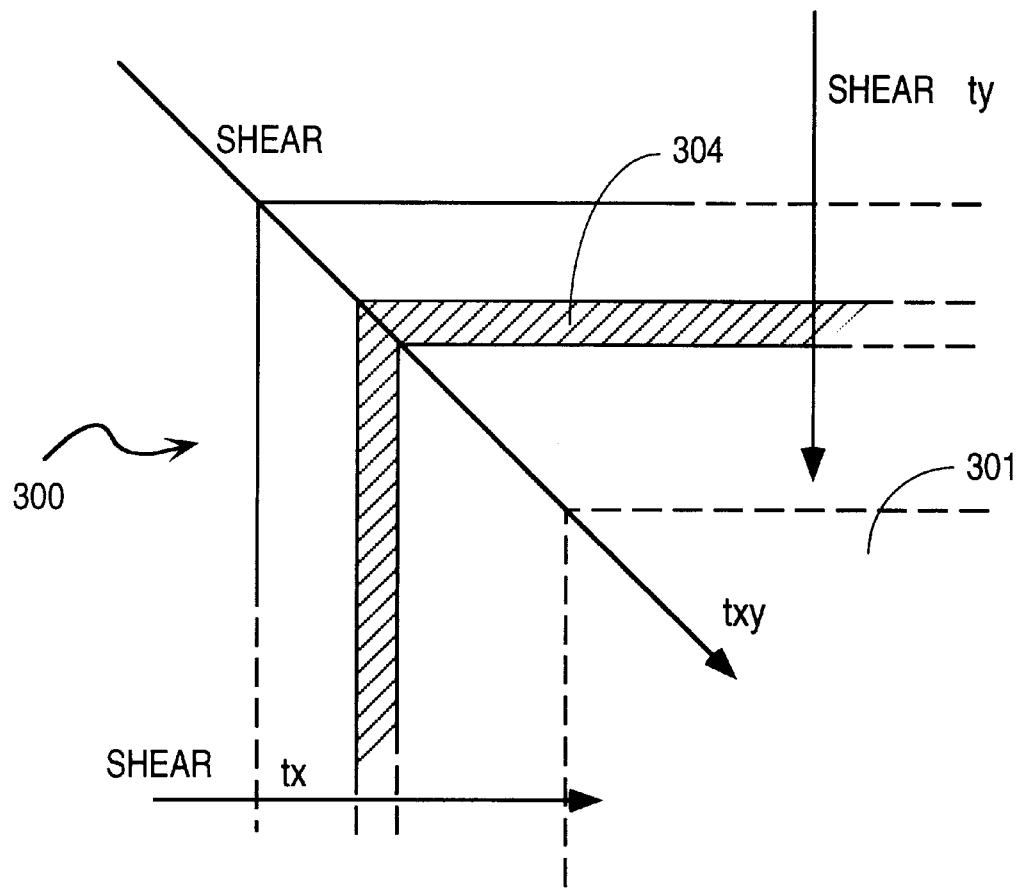
FIG. 3 illustrates a die with a conventional guard ring surrounding a die active area.
Figure 4:
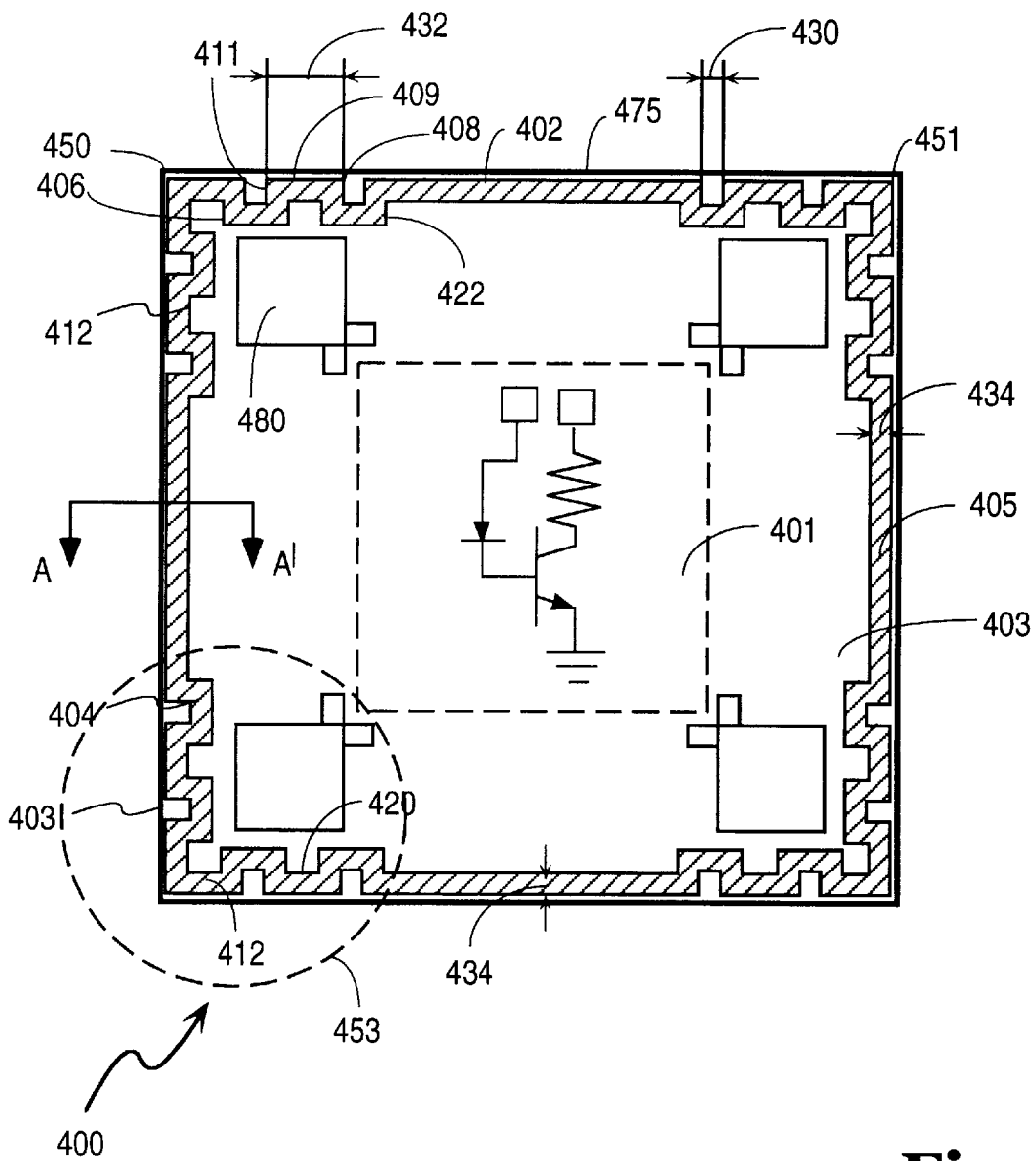
FIG. 4 illustrates a top view of an embodiment of an integrated circuit with a guard ring according to the present invention.

FIG. 4 illustrates a top view of an embodiment of a die (integrated circuit (IC)) 400 according to the present invention. The integrated circuit includes a silicon substrate (not shown) upon which dielectric and metal layers are formed. The metal layers are interposed between the dielectric layers. A terminal metal layer (TML) 402 of which guard ring 404 is carved out, is formed upon a terminal dielectric layer 403. Terminal dielectric layer 403 is the most remote layer of dielectric from the silicon substrate in a direction perpendicular to the Figure. TML 402 is the most remote layer of metal from the silicon substrate, in a direction perpendicular to the Figure.

Guard ring 404 is electrically insulated from the die active area 401, and is formed outside the die active area in the vicinity of edges 475 of the IC and in the vicinity of corners 450 of the IC. The die active area 401 includes active and passive electrical structures that form electrical circuits. Guard ring 404 includes four sides 405 running along each edge 475 of the IC. In the embodiment of the present invention described herein, the four sides 405 form a contour similar to a rectangle. To prevent breaking of the guard ring during reliability testing when shear forces are acting upon the guard ring and to prevent delamination of the passivation layer, the guard ring 404 of the embodiment of the IC of the present invention described herein includes zig-zag portions 412 adjacent the corners 450 thereof. The zig-zag portions are shown in dotted circle 453. Each zig-zag portion 412 includes at least one tooth 420. In the embodiment of the present invention described herein the guard ring 404 includes a plurality of teeth 420 at each end of each side 405 near each corner 450 of the guard ring.

The zig-zag portions of the guard ring 404 include alternating continuous concave and convex portions (teeth). For example, one convex portion 408 has a side 409 that is substantially parallel to the upper side 475 (horizontally disposed in the Figure) of the die and two sides 411 parallel to the other sides perpendicular to the upper side 475. Sides 409 and 411 are substantially perpendicular to each other.

In FIG. 4, on each side of tooth 408, there are 2 teeth 406 and 422 that have a concave shape. The concave portion has a width 430 while the convex portion has a width 432. As both understood by the term zig-zag and illustrated in FIG. 4, each of tooth 406, 408, and 422 may be defined by a second line segment disposed between a first line segment and a third line segment, where the length of the first line segment and the third line segment may be different (for example, shorter) than the length of the second line segment. Where the length of the first line segment and the third line segment differ from the length of the second line segment, each tooth may have the shape of an elongated rectangle as illustrated in FIG. 4. Although FIG. 4 illustrates that width 430 may be less than width 432, it has been found that for maximum benefit, i.e., for maximum strength of the guard ring 404 the widths 430 and 432 are substantially equal. A non-zig-zagged portion (straight portion) 405 of the guard ring 404, that joins two adjacent zig-zagged portions 412, has a thickness 434 (viewed from the top). As illustrated in FIG. 4, straight portion 405 may have a different length than each of the line segments of a tooth, such as tooth 406, 408, or 422. The length of straight portion 405 may be different than the length of each line segment in that the length of straight portion 405 may be longer than the length of each line segment. The thickness of portion 405 and the widths of the teeth may be varied and may be calculated for maximum benefits. The die 400 further includes alignment structures 480 provided near the corners of guard ring 404 that may be used for pattern recognition. Aligning structures in dies are well-known in the art.

Figure 5:
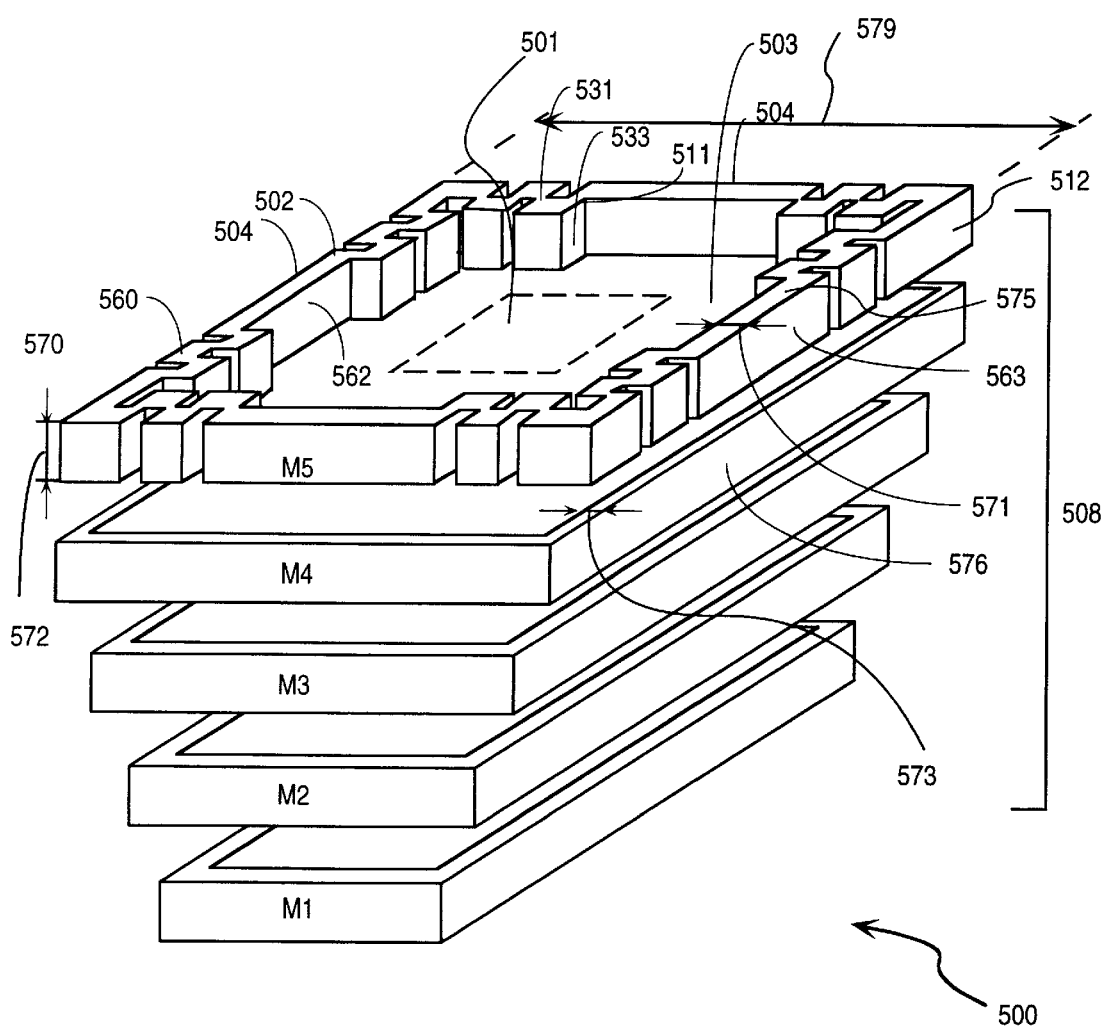
FIG. 5 illustrates a simplified top and lateral view of an embodiment of an integrated circuit with a guard ring according to the present invention.

FIG. 5 illustrates a simplified top and lateral view of an embodiment of an integrated circuit (IC) 500. IC 500 includes metal layers (M1, M2, M3, M4, M5) interposed between layers of dielectric (not shown). M5 is a terminal metal layer (TML) 502 and includes guard ring 504 formed out of TML layer 502. Guard wall 508 is "carved out" of the terminal layer (M5) and of the rest of the metal layers (M4, M3, M2, M1) of the integrated circuit 500 to protect the die active area. Note that the present invention also applies to an IC that only has one layer of metal and one layer of dielectric.

Guard ring 504 is formed out of the TML 502. Guard ring 504 includes zig-zag shaped portions 512 to prevent breaking, shearing, and delamination of the guard ring. Zig-zag shaped portions 512 are positioned at and near corners of the die. Surfaces 531 and 533 adjacent sides 511 increase the area of adherence of the guard ring 504 to a passivation layer (not shown) typically deposited over guard ring 504. Therefore the embodiment of the IC 500 according to the present invention, besides providing strength against breaking, shearing, and delamination by way of the zig-zag shaped portions 512 also provides extra surfaces offered by surfaces 531 and 533. Guard ring 504 includes top surface 560, lateral external surface 563 and lateral inner surface 562. The guard ring 504 with its zig-zag shaped portions 512 do not interfere with active area 501, as the guard ring 504 with its zig-zag portions is placed outside the active area 501 and is electrically insulated therefrom. In the embodiment of the present invention described herein, guard ring 504 is formed by using processes well-known in the art such as photolithography, patterning, etching, etc.

In one embodiment according to the present invention, the die has a rectangular shape, the guard ring 504 has a rectangular-loop shape, and each tooth includes 3 parallelipipedical segments. The placement of the zig-zag shaped portions 512 near the corners of the die is useful, in that typically stress concentration is higher at the corners and edges of the die. The zig-zag shaped portions 512 need not be disposed near all corners of the die, but only near those corners of the die that are more susceptible to damage, such as the corners where the density of metal structures per unit of surface is lower.

In the embodiment according to the present invention explained herein, the width 571 of a side 575 of guard ring 504 is larger than width 573 of a side 576 of a guard ring formed in metal layer $M_4$. In the embodiment of the present invention described herein, the width 571 is approximately 6 µm, while width 573 is approximately equal to 4 µm. The widths of the other metal layers ($M_1$–$M_3$) are equal therebetween and measure approximately 4 µms. In other embodiments according to the present invention, the widths of guard rings of metal layers $M_4$, $M_3$, $M_2$, and $M_1$ may progressively decrease. By having a wider guard ring 504, adhesion between the passivation layer and guard ring 504 is increased. Also, it has been found that a wider guard ring 504 makes the guard wall 508 stronger. In one embodiment according to the present invention, TML includes Aluminum/Copper or combination thereof. The guard ring 504 including zig-zag shaped portions 512 have a height 572 of approximately 3 µm. A width of the die may have a size of approximately ½ centimeters but such size is not limited to ½ centimeters.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An integrated circuit, comprising:
    a substrate having at least two adjacent corners, wherein each corner includes two sides;
    at least one dielectric layer and a terminal metal layer, each layer formed upon the substrate to include a die active area; and
    a guard ring formed out of the terminal metal layer so as to enclose the die active area, the guard ring having a zig-zag shaped portion at each side of each corner, wherein each zig-zag shaped portion includes at least two teeth coupled to one another, wherein each tooth is defined by a second line segment disposed between a first line segment and a third line segment, wherein each line segment has a length, and wherein a continuous straight portion couples two adjacent zig-zag shaped portions, the continuous straight portion having a length that is different than the length of each line segment of at least one zig-zag shaped portion.

2. The integrated circuit of claim 1 wherein the guard ring has four sides that form a rectangle and wherein the length of each first and third line segment are different than the length of each second line segment.

3. The integrated circuit of claim 1 wherein each zig-zag shaped portion includes alternating concave and convex portions.

4. The integrated circuit of claim 3 wherein the alternating concave and convex portions are continuous, wherein the length of the continuous straight portion is greater than the length of each line segment.

5. The integrated circuit of claim 3 wherein the alternating concave and convex portions have a rectangular shape.

6. The integrated circuit of claim 1, the integrated circuit further comprising:
    a plurality of alignment structures disposed external to the die active area and within the guard ring and wherein each zig-zag shaped portion is located at a predetermined distance from each alignment structure.

7. The integrated circuit of claim 1, each zig-zag shaped portion including alternating concave and convex teeth, wherein each concave tooth is separated from each other concave tooth, the integrated circuit further comprising:
    a passivation layer adhering to the guard ring.

8. An integrated circuit, comprising:
    a substrate having at least two adjacent corners, wherein each corner includes two sides; and
    a plurality of dielectric layers and metal layers formed upon the substrate to include a die active area, the dielectric layers including a terminal dielectric layer, the metal layers including a terminal metal layer formed upon the terminal dielectric layer,
    the terminal metal layer having formed therein a guard ring so as to enclose the die active area, the guard ring having a zig-zag shaped portion at each side of each corner, wherein each zig-zag shaped portion includes at least two teeth coupled to one another, wherein each tooth is defined by a second line segment disposed between a first line segment and a third line segment, wherein each line segment has a length, and wherein a continuous straight portion couples two adjacent zig-zag shaped portions, the continuous straight portion having a length that is different than the length of each line segment of at least one zig-zag shaped portion.

9. The integrated circuit of claim 8 wherein the guard ring has four sides that form a rectangle.

10. The integrated circuit of claim 8 wherein each zig-zag shaped portion includes alternating concave and convex portions.

11. The integrated circuit of claim 10 wherein the alternating concave and convex portions are continuous.

12. The integrated circuit of claim 10 wherein each of the alternating concave and convex portions have an elongated rectangular shape.

13. The integrated circuit of claim 8, the integrated circuit further comprising:
    a plurality of alignment structures disposed external to the die active area and within the guard ring and wherein each zig-zag shaped portion is located at a predetermined distance from each alignment structure.

14. The integrated circuit of claim 8, each zig-zag shaped portion including alternating concave and convex teeth, wherein each concave tooth is separated from each other concave tooth, the integrated circuit further comprising:
    a passivation layer adhering to the guard ring.

15. An integrated circuit, comprising:
    a substrate having a surface and at least a first corner and a second corner wherein each corner includes a first side and a second side;
    at least one dielectric layer and a metal layer including metal structures, each layer formed upon the substrate to include a die active area, wherein the first corner is identified in that the density of metal structures per unit of surface is lower at the first corner than at the second corner; and
    a guard ring formed out of the metal layer so as to enclose the die active area, the guard ring having a zig-zag shaped portion at the first side of the first corner.

16. The integrated circuit of claim 15, the guard ring having a zig-zag shaped portion at the second side of the first corner and having a continuous straight portion extending from each zig-zag shaped portion away from the first corner, wherein each zig-zag shaped portion includes at least two teeth coupled to one another, wherein each tooth has the shape of an elongated rectangle.

* * * * *

UNITED STATES PATENT AND TRADEMARK OFFICE
CERTIFICATE OF CORRECTION

PATENT NO.   : 6,163,065
DATED        : December 19, 2000
INVENTOR(S)  : Seshan et al.

It is certified that error appears in the above-identified patent and that said Letters Patent is hereby corrected as shown below:

Column 4,
Line 42, before "surfaces", insert -- adhering --.

Signed and Sealed this

Third Day of September, 2002

*Attest:*

*Attesting Officer*

JAMES E. ROGAN
*Director of the United States Patent and Trademark Office*